United States Patent
Ulherr et al.

(10) Patent No.: US 9,462,735 B2
(45) Date of Patent: Oct. 4, 2016

(54) LC MODULE FOR INSTALLATION IN A MOTOR VEHICLE CONTROL DEVICE

(71) Applicant: CONTI TEMIC MICROELECTRONIC GMBH, Nuremberg (DE)

(72) Inventors: Marcus Ulherr, Schwarzenbruck (DE); Cristian Minzat, Timisoara (RO)

(73) Assignee: Conti Temic Microelectronic GmbH, Nuremberg (DE)

( * ) Notice: Subject to any disclaimer, the term of this patent is extended or adjusted under 35 U.S.C. 154(b) by 0 days.

(21) Appl. No.: 14/441,592

(22) PCT Filed: Nov. 4, 2013

(86) PCT No.: PCT/DE2013/200266
§ 371 (c)(1),
(2) Date: May 8, 2015

(87) PCT Pub. No.: WO2014/071941
PCT Pub. Date: May 15, 2014

(65) Prior Publication Data
US 2015/0305214 A1 Oct. 22, 2015

(30) Foreign Application Priority Data
Nov. 8, 2012 (DE) .......... 10 2012 110 683

(51) Int. Cl.
*H05K 13/00* (2006.01)
*H05K 13/04* (2006.01)
(Continued)

(52) U.S. Cl.
CPC ........... *H05K 13/0023* (2013.01); *B60R 16/03* (2013.01); *H01G 2/106* (2013.01);
(Continued)

(58) Field of Classification Search
CPC ........ H05K 13/00; H05K 13/04; H05K 7/00; H05K 5/0056; H01G 2/04; H01G 2/10; H01G 2/106; H01G 9/08; H01G 9/26; H01G 9/28; B60R 16/03; Y10T 29/49171; H03H 7/0115; H03H 1/1766; H01F 22/324; H01F 22/327
USPC ............... 361/601, 605, 622, 624, 679.46, 361/679.54, 704, 714, 763, 767; 165/80.2, 165/80.3, 104.33, 185; 174/16.3, 520, 526, 174/527, 50; 333/175, 184, 185; 29/846, 29/854, 855
See application file for complete search history.

(56) References Cited

U.S. PATENT DOCUMENTS 3,219,884 A * 11/1965 Chessin ................ H01F 27/022
174/565
4,453,144 A * 6/1984 Tamura ................... H01F 27/40
333/140
(Continued)

FOREIGN PATENT DOCUMENTS

DE 102007009100 A1 8/2008
EP 1995439 A2 11/2008
(Continued)

*Primary Examiner* — Michail V Datskovskiy
(74) *Attorney, Agent, or Firm* — Laurence A. Greenberg; Werner H. Stemer; Ralph E. Locher

(57) ABSTRACT

An LC module for installation in a housing of a motor vehicle control device, a method for producing an LC module and a corresponding motor vehicle control device having an LC module. The LC module has a support plate, at least one electrolytic capacitor and a coil. The electrolytic capacitor and the coil are disposed in chambers of the LC module and are at least partially surrounded by casting compound. Furthermore, the support plate has a connecting part between the two chambers, the support plate being form-fittingly or frictionally connectable to the housing of the control device at least in the region of the connecting part.

8 Claims, 2 Drawing Sheets

(51) Int. Cl.
*H01G 2/10* (2006.01)
*H01G 9/26* (2006.01)
*H01G 9/28* (2006.01)
*H05K 5/02* (2006.01)
*B60R 16/03* (2006.01)
*H05K 5/00* (2006.01)
*H01G 4/40* (2006.01)
*H01G 2/04* (2006.01)

(52) U.S. Cl.
CPC ............... *H01G 9/26* (2013.01); *H01G 9/28* (2013.01); *H05K 5/0026* (2013.01); *H05K 5/0056* (2013.01); *H05K 5/0286* (2013.01); *H05K 13/046* (2013.01); *H01G 2/04* (2013.01); *H01G 4/40* (2013.01)

(56) References Cited

U.S. PATENT DOCUMENTS

| | | | | |
|---|---|---|---|---|
| 4,777,461 | A * | 10/1988 | Sakamoto | H03H 7/0115 333/184 |
| 6,445,593 | B1 * | 9/2002 | Okuyama | H01F 17/0013 257/421 |
| 6,946,945 | B2 * | 9/2005 | Sato | H01C 1/028 336/200 |
| 7,899,602 | B2 * | 3/2011 | Yoshinari | F02D 41/20 123/490 |
| 7,972,123 | B2 | 7/2011 | Koide et al. | |
| 8,050,037 | B2 * | 11/2011 | Tsuyuno | H05K 1/141 165/104.33 |
| 8,184,438 | B2 | 5/2012 | Kaneko et al. | |
| 2009/0086437 | A1 | 4/2009 | Tsuyuno et al. | |

FOREIGN PATENT DOCUMENTS

| | | | | |
|---|---|---|---|---|
| EP | 2043416 A2 | 4/2009 | | |
| FR | 2347851 A1 | 11/1977 | | |
| WO | WO03100971 A1 * | 12/2003 | ........... | H01F 17/033 |

* cited by examiner

LC MODULE FOR INSTALLATION IN A MOTOR VEHICLE CONTROL DEVICE

BACKGROUND OF THE INVENTION

1. Field of the Invention

The invention relates to an LC module for installing in a housing of a motor vehicle control device, wherein the LC module comprises a carrier place, at least one electrolytic capacitor and a coil, and to a method for producing said module as claimed, and also a control device having an LC module as claimed.

During the construction of motor vehicles, it is currently common to integrate control devices for motors or transmissions into the motor vehicle assembly that is to be controlled, in particular motors or transmissions. Above all, the transmission control devices form an extremely compact unit as a periphery control device. In comparison to conventional applications of external control devices, this arrangement has enormous advantages in relation to quality, costs, weight and functionality. As a result of said arrangement, in particular the number of plug connections and lines and consequently the possible causes of failure are reduced.

The integration of the control device in the transmission places great demands on its ability to withstand thermal and mechanical loads. The functionality must be ensured both over a wide temperature range (approximately −40° C. to 150° C.) as well as in the case of extreme mechanical vibrations (up to 40 g).

A control device of this type is described in EP 1 995 439 A2. An LC module having an amplifying coil and an electrolytic capacitor is arranged in the control device housing. The LC module comprises a block made from resin that can withstand extreme temperatures into which is molded a current rail made of copper. This current rail is in turn equipped with external contacts by way of which the LC module is connected to the switch carrier of the control device in an electrical manner. A resilient plate having a high conductivity is arranged between the LC module and the lid of the control device in order to effectively dissipate the heat that is produced by the amplifying coil and the electrolytic capacitor by way of the lid to the surrounding area of the control device. The LC module is by way of example screwed to the housing.

The amplifying coil and the electrolytic capacitor are bonded to the block made from resin that can withstand extreme temperatures, whereby the susceptibility to malfunction due to vibrations is to be reduced.

In the case of larger and heavier electronic components, these measures of the bonding fastening arrangement in control devices cannot guarantee long term stability if these measures are subjected to the above mentioned extreme conditions.

BRIEF SUMMARY OF THE INVENTION

It is therefore an object of the present invention to provide an LC module having a sufficient resistance to oscillation and vibration.

This object is achieved in accordance with the invention by means of an LC module as claimed. Advantageous further developments are the subject matter of the dependent claims.

In accordance with the invention, the carrier plate of the LC module comprises two spatially separated chambers, wherein at least one electrolytic capacitor is arranged in the first chamber and a coil is arranged in the second chamber.

The electrolytic capacitor and the coil are embedded and therefore fixed in the respective chamber at least in part in a casting compound, in particular a standard, thermosetting casting compound. The carrier plate comprises a connecting piece between the two chambers and the carrier plate can be connected to the housing of a control device in a positive-locking or non-positive-locking manner for example by means of a screw or a rivet in the region of said connecting piece.

As a result of this connection of the LC module to the housing of a control device in the region of the connecting piece between the chambers, both the frequency as well as the amplitude of the oscillations that are transmitted by means of the vibration, above all of the motor, to the electronic components of the LC module are damped. As a consequence, the susceptibility to malfunction of the electronic components of the LC module is reduced and simultaneously their serviceable life is increased.

Each chamber advantageously comprises at least on its inner surface or outer surface throughplated contacts that render possible an electrical connection between the supply lines of the electronic components of the LC module and components, such as actuators or sensors, outside of the LC module or rather control device.

In particular, two walls are arranged on the carrier plate of the LC module in the region of the connecting piece between the two chambers in such a manner that as a consequence, a third chamber is embodied between the chambers. At least one wall of this third chamber comprises a slot to mechanically "decouple" the mass of the first and the second chamber to further improve the resistance to vibration of the LC module. The slot or rather the slots advantageously have a V-form.

Alternatively, two electrolytic-capacitors can also be housed in the first chamber.

A further object of the present invention is to provide a method for producing an LC module as claimed.

This object is achieved in accordance with the invention by means of a method as claimed.

The method in accordance with the invention comprises the steps:

a) Providing a carrier plate, at least one electrolytic-capacitor and a coil, wherein the carrier plate comprises chambers for receiving an electrolytic capacitor and a coil,
b) Inserting the electrolytic capacitor or the electrolytic capacitors into the first chamber,
c) Inserting the coil into the second chamber,
d) Electrically connecting the supply lines of an electrolytic capacitor to the corresponding throughplated contacts on an inner surface or outer surface of the associated chamber,
e) Electrically connecting the supply lines of the coil to the corresponding throughplated contacts of the associated chamber,
f) Pouring casting compound into the chambers so that electrolytic capacitors and coils are surrounded at least in part by casting compound, and
g) Thermosetting the casting compound, by way of example using UV light.

In an alternative method, the casting compound is initially poured into the chambers of the LC module, and the electronic components are subsequently inserted and electrically connected, wherein the sequence of producing the connection is irrelevant. This alternative method has the advantage that the fill level of the casting compound can be better controlled in a chamber.

The LC module is preferably installed in the motor vehicle control devices, wherein the carrier plate of the LC module is connected to the housing of the control device in a positive-locking manner or a non-positive-locking manner, by way of example by means of a screw or a rivet. Advantageously, the space between the electrolytic capacitor and the housing or rather the coil and the housing is filled with heat-conducting paste. This is used on the one hand in particular as a further measure to damp oscillation, on the other hand the heat that is produced in the electronic components is dissipated to the housing.

The features and details of the invention in conjunction with the attached drawings are further explained in the description hereinunder with reference to exemplary embodiments.

BRIEF DESCRIPTION OF THE SEVERAL VIEWS OF THE DRAWING

Features and interrelations that are described in individual variants can be fundamentally transferred to all exemplary embodiments. In the drawings.

DESCRIPTION OF THE INVENTION

Figure 1:
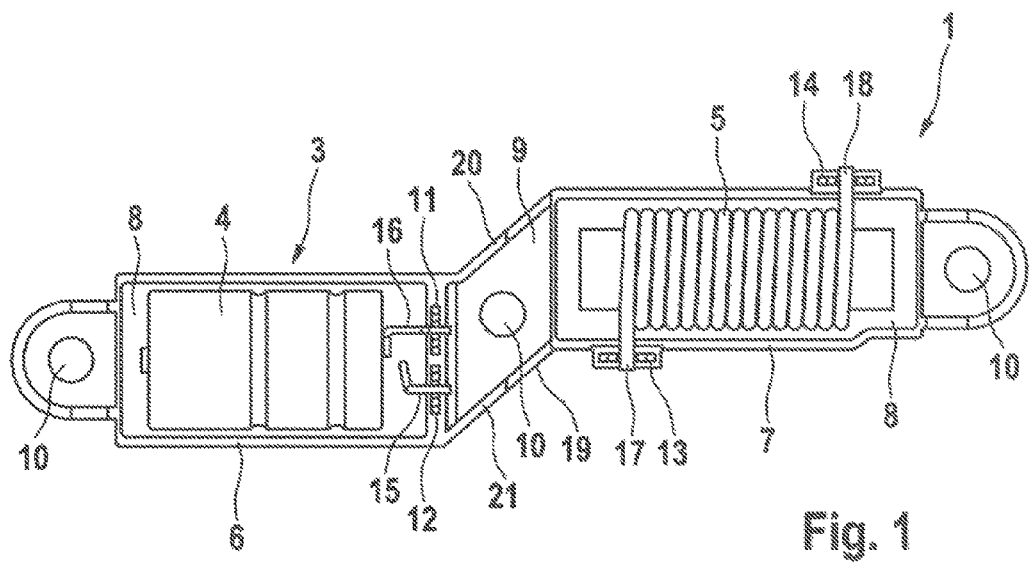
FIG. 1 illustrates a plan view of the LC module.

FIG. 1 illustrates an LC module 1 for installing in a housing of a motor vehicle control device, in particular a so-called periphery control device. The LC module 1 essentially comprises a carrier plate 3, an electrolytic capacitor 4 and a coil 5. The carrier plate 3 essentially comprises two spatially separated chambers 6, 7, wherein the electrolytic capacitor 4 is arranged in the first chamber 6, and the coil 5 is arranged in the second chamber 7. The electrolytic capacitor 4 and the coil 5 are at least in part surrounded by the casting compound 8. The casting compound 8 is for example a heat-resistant resin and fixes the electronic components 4 and 5 in the corresponding chambers 6, 7. The electrical supply lines 15, 16 of the electrolytic capacitor 4 are electrically connected to the throughplated contacts 11, 12, for example welded or soldered. The throughplated contacts 11, 12 are integrated on an inner surface of the chamber 6. The electrical supply lines 17, 18 of the coil 5 are electrically connected to the throughplated contacts 13, 14, wherein the throughplated contacts 13, 14 are arranged on an outer surface of the chamber 7.

The throughplated contacts 11, 12, 13, 14 can in each case be selectively arranged on an inner surface or an outer surface of the corresponding chamber 6, 7. The throughplated contacts 11, 12, 13, 14 render possible the electrical connection between the supply lines 15, 16, 17, 18 and components outside the LC module or rather the control device. The carrier plate 3 comprises a connecting piece 9 between the two chambers 6, 7.

In particular, a fastening device in the form of a circular aperture 10 is arranged in this connecting piece 9.

The form can deviate from the circular form. The LC module 1 can be connected to the housing 2 of the control device by means of this aperture 10 in a positive-locking manner or a non-positive-locking manner by way of example by means of a screw or a rivet. This is in particular illustrated in FIG. 3.

This positive-locking or non-positive-locking connection of the LC module 1 to the housing 2 in the region of the connecting piece 9 between the chambers 6, 7 delivers the greatest contribution to the damping of the oscillations, both in relation to the frequency as well as the amplitude that are transmitted by means of the vibration above all of the motor to the LC module, and therefore to the electrolytic capacitor 4 and the coil 5.

The damping of the oscillations is all the more important the larger and heavier the electronic components 4, 5 that are installed in the chambers 6 and 7, in particular for larger electrolytic capacitors 4 having a cup diameter greater than or equal to 18 mm and a weight from 12 g or rather for coils 5 having a weight from 40 g.

As a result of this arrangement, the susceptibility to failure of the electronic components 4, 5 of the LC module 1 is reduced and simultaneously the serviceable life of said components is increased. Additional connections of the LC module 1 to the housing 2 can also be provided in particular through the openings 10 that are arranged on the carrier plate 3 on the side of the chamber 6 or rather 7 that lies opposite the connecting piece 9. The contribution of the outer fastening device 10 to the damping of oscillation is however less than that of the connection in the region of the connecting piece 9 between the chambers 6, 7.

In particular, two walls 20, 21 are arranged on the carrier plate 3 of the LC module 1 in the region of the connecting piece 9 between the two chambers 6, 7 in such a manner that as a consequence, a third chamber 19 is embodied between the chambers 6, 7.

Figure 2:
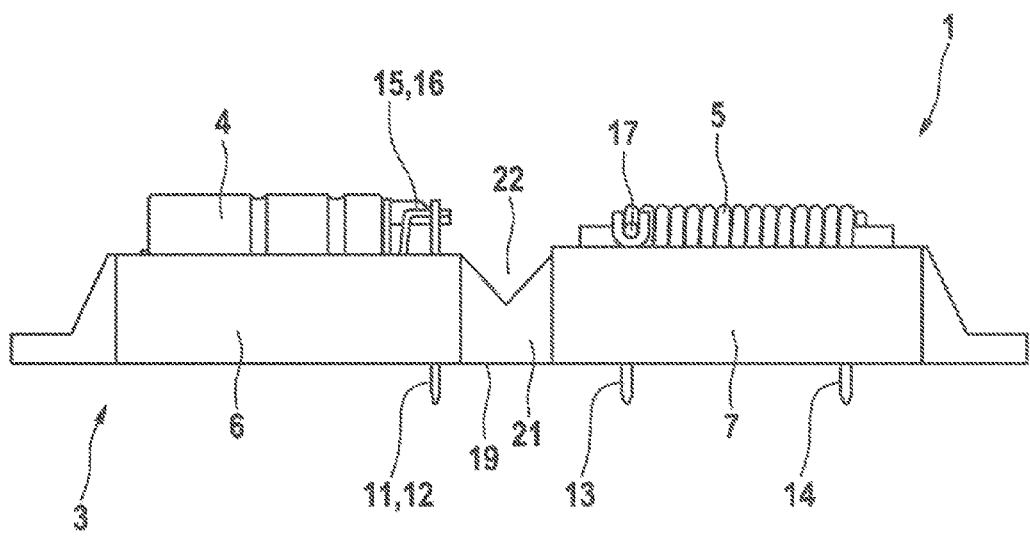
FIG. 2 illustrates a side view of the LC module.

FIG. 2 illustrates a side view of the LC module 1. At least one wall 20, 21 of the third chamber 19 comprises a slot 22 for mechanically "decoupling" the masses in the first chamber 6 and the second chamber 7 to further improve the resistance to vibration of the LC module 1. The slot or rather the slots 22 advantageously have a V-form but can also be embodied by way of example in a right-angled manner.

Figure 3:
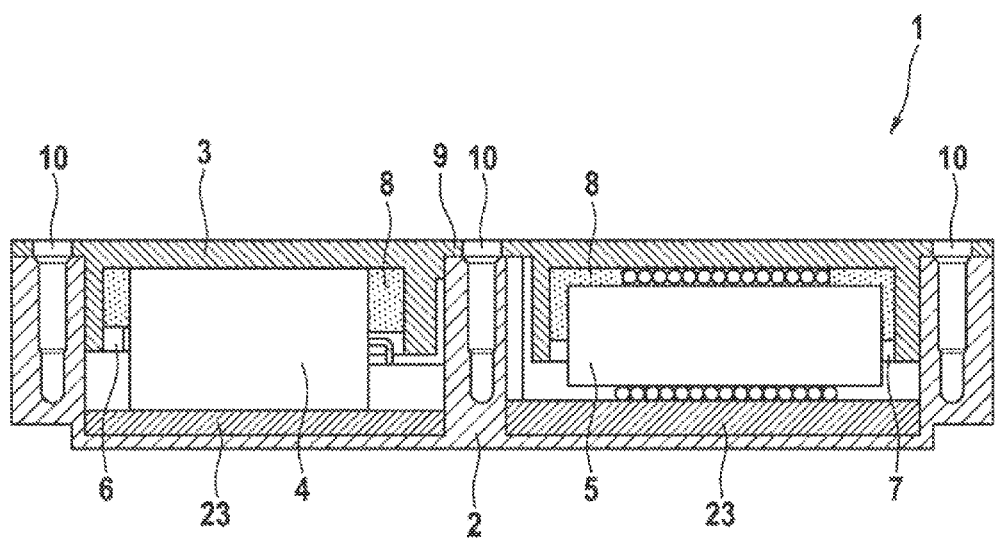
FIG. 3 illustrates a section through the LC module and a housing section.

FIG. 3 illustrates a section through the LC module 1 and a housing 2 of a control device, said housing being connected to the LC module 1, wherein the housing 2 is illustrated only in sections. In particular, heat-conducting paste is arranged between the electrolytic capacitor 4 and the housing 2 or rather between the coil 5 and the housing 2. This is used on the one hand in particular as a further measure to damp oscillation, on the other hand the heat that occurs in the electronic components 4, 5 is reliably dissipated to the housing.

In conclusion, it is to be mentioned that the arrangement of the supply lines 15, 16, 17, 18 of the electronic components 4, 5 is not restricted to the manner that is illustrated in the figures.

LIST OF REFERENCE NUMERALS

1 LC Module
2 Housing of a Motor Vehicle Control Device
3 Carrier Plate
4 Electrolytic Capacitor
5 Coil
6 First Chamber
7 Second Chamber
8 Casting Compound
9 Connecting Piece between the Chambers
10 Fastening Device
11, 12 Throughplated contacts of the First Chamber
13, 14 Throughplated contacts of the Second Chamber
15, 16 Electrical Supply Lines of the Electrolytic Capacitor
17, 18 Electrical Supply Lines of the Coil
19 Third Chamber 20, 21 Wall of the Third Chamber
22 Slot in the Wall of the Third Chamber
23 Heat-Conducting Paste

The invention claimed is:

1. An LC module for installation in a housing of a motor vehicle control device, the LC module comprising:
   a carrier plate formed with first and second chambers that are spatially separated from one another;
   at least one electrolytic capacitor disposed in said first chamber;
   a coil disposed in said second chamber;
   said electrolytic capacitor and said coil being at least in part surrounded by casting compound in said chambers; and
   said carrier plate having a connecting piece between said first and second chambers, said carrier plate being configured to be connected, at least in a region of said connecting piece, to the housing of the control device with a positive-locking connection or a non-positive-locking connection.

2. The LC module according to claim 1, wherein each said chamber comprises through plated contacts on an inner surface or outer surface thereof and said through plated contacts enabling an electrical connection between supply lines of said electrolytic capacitor and said coil with components outside the LC module.

3. The LC module according to claim 1, wherein two walls are arranged on the carrier plate in the region of the connecting piece between said first and second chambers, to thereby form a third chamber between said first and second chambers, and wherein at least one of said walls is formed with a slot.

4. The LC module according to claim 1, wherein said at least one electrolytic capacitor is one of two electrolytic capacitors disposed in said first chamber.

5. A method of producing an LC module according to claim 1, the method comprising:
   a) providing a carrier plate with a first chamber and a second chamber, at least one electrolytic-capacitor, and a coil,
   b) inserting the at least one electrolytic capacitor into the first chamber;
   c) inserting the coil into the second chamber;
   d) electrically connecting supply lines of the electrolytic capacitor to throughplated contacts;
   e) electrically connecting supply lines of the coil to through plated contacts;
   f) filling the chambers with casting compound; and
   g) thermosetting the casting compound.

6. A method of producing an LC module according to claim 1, the method comprising:
   a) providing a carrier plate with two chambers, at least one electrolytic-capacitor, and a coil;
   b) filling the chambers with casting compound;
   c) inserting the electrolytic capacitor into one of the chambers;
   d) inserting the coil into another chamber;
   e) electrically connecting supply lines of the electrolytic capacitor to throughplated contacts;
   f) electrically connecting the supply lines of the coil to through plated contacts; and
   g) thermosetting the casting compound.

7. A motor vehicle control device, comprising:
   a housing of the control device;
   an LC module comprising: a carrier plate formed with first and second chambers that are spatially separated from one another; at least one electrolytic capacitor disposed in said first chamber; a coil disposed in said second chamber; said electrolytic capacitor and said coil being at least in part surrounded by casting compound in said chambers; and said carrier plate having a connecting piece between said first and second chambers, said carrier plate being configured to be connected, at least in a region of said connecting piece, to the housing of the control device with a positive-locking connection or a non-positive-locking connection, said LC module connected to said housing with a positive-locking connection or a non-positive-locking connection, at least in a region of the connecting piece of the carrier plate of the LC module.

8. The motor vehicle control device according to claim 7, which comprises an amount of heat-conducting paste filling one or both of a space between the electrolytic capacitor and the housing or a space between the coil and the housing.

* * * * *